United States Patent
Kanazawa et al.

(10) Patent No.: US 7,162,009 B2
(45) Date of Patent: Jan. 9, 2007

(54) X-RAY MULTI-LAYER MIRROR AND X-RAY EXPOSURE APPARATUS

(75) Inventors: Hidehiro Kanazawa, Kanagawa (JP); Kenji Ando, Kanagawa (JP); Kyoko Imai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 33 days.

(21) Appl. No.: 10/902,149

(22) Filed: Jul. 30, 2004

(65) Prior Publication Data
US 2005/0031071 A1 Feb. 10, 2005

(30) Foreign Application Priority Data
Aug. 8, 2003 (JP) ............... 2003-206629

(51) Int. Cl.
  *G21K 23/201* (2006.01)
  *G21K 5/00* (2006.01)
(52) U.S. Cl. ............... 378/84; 378/85; 378/34
(58) Field of Classification Search ......... 378/34, 378/84, 85; 359/359, 884, 361, 584, 586
See application file for complete search history.

(56) References Cited

U.S. PATENT DOCUMENTS

| | | | | |
|---|---|---|---|---|
| 5,958,605 A | * | 9/1999 | Montcalm et al. | 428/627 |
| 6,160,867 A | * | 12/2000 | Murakami | 378/84 |
| 6,295,164 B1 | * | 9/2001 | Murakami et al. | 359/584 |
| 6,333,961 B1 | * | 12/2001 | Murakami | 378/35 |
| 6,385,290 B1 | * | 5/2002 | Kondo et al. | 378/84 |
| 6,396,900 B1 | * | 5/2002 | Barbee et al. | 378/84 |
| 6,441,963 B1 | * | 8/2002 | Murakami et al. | 359/584 |
| 6,449,086 B1 | | 9/2002 | Singh | 359/361 |
| 6,724,462 B1 | | 4/2004 | Singh et al. | 355/53 |
| 6,738,188 B1 | | 5/2004 | Singh | 359/359 |
| 2003/0147058 A1 | * | 8/2003 | Murakami et al. | 355/53 |

FOREIGN PATENT DOCUMENTS

| | | | |
|---|---|---|---|
| JP | 405034500 A | * | 9/1993 |
| JP | 2001-51106 | | 2/2001 |

* cited by examiner

*Primary Examiner*—Edward J. Glick
*Assistant Examiner*—Irakli Kiknadze
(74) *Attorney, Agent, or Firm*—Fitzpatrick, Cella, Harper & Scinto

(57) ABSTRACT

An X-ray multi-layer mirror having a reflection characteristic with a wider incident angle range is realized by conducting optimization processing on an Mo/Si alternate layer having a constant thickness. Film thickness distributions of Si layers and Mo layers in the Mo/Si alternate layer are determined by optimization processing for widening the angle reflection characteristic of the Mo/Si alternate layer having the constant thickness, which is a fundamental structure.

2 Claims, 6 Drawing Sheets

X-RAY MULTI-LAYER MIRROR AND X-RAY EXPOSURE APPARATUS

This application claims priority from Japanese Patent Application No. 2003-206629 filed Aug. 8, 2003, which is hereby incorporated by reference herein.

BACKGROUND OF THE INVENTION

1. Field of the Invention

The present invention relates to an X-ray multi-layer mirror used as a reflecting mirror in a projection optical system or the like and an X-ray exposure apparatus using the X-ray multi-layer mirror.

2. Related Background Art

In an X-ray exposure apparatus using a soft X-ray having a wavelength of 13.5 nm or less, a multi-layer film structure is necessarily used to obtain a mirror having a high reflectance outside a total reflection incident angle range. There has been widely known a structure using a distributed Bragg reflecting material similar to a ¼-wavelength stack having an entirely constant film thickness. For example, when a mirror for an X-ray having a wavelength of 13.4 nm includes an Mo/Si alternate layer having a constant film thickness fundamental structure, which is composed of an Mo layer having a film thickness of 2.8 nm and an Si layer having a film thickness of 4.1 nm, a maximum theoretical reflectance exceeds 70% (see Japanese Patent Application Laid-open No. 2001-51106).

However, in the Mo/Si alternate layer having the constant film thickness fundamental structure, a range of an X-ray incident angle at which a high reflectance is obtained is only within about 10 degrees. Therefore, with respect to a light beam incident at an incident angle outside this range, a significant reduction in reflectance is caused.

According to Japanese Patent Application Laid-open No. 2001-51106, there is proposed an alternate multi-layer film having a non-uniform film thickness structure in which Ru or the like is used as a third material for the Mo/Si alternate layer and the thickness of each layer is changed by numeric repetition optimization processing, for example, the film thickness of the Mo layer is changed from about 1 nm or less to near 2 nm.

However, in the Mo/Si alternate layer which is widely used for a mirror for the soft X-ray having the wavelength of 13.5 nm and made of two materials of Mo and Si, Mo and Si are easy to react with each other and form a compound of MoSix at an interface. Therefore, when a design film thickness obtained by optimization processing reduces, a design value is significantly different from a reflection characteristic after film formation in some cases.

SUMMARY OF THE INVENTION

The present invention has been made in view of the problem that is not solved in the above-mentioned background art. An object of the present invention is to provide an X-ray multi-layer mirror capable of surely realizing a target reflectance in a wide incident angle range and an X-ray exposure apparatus using the X-ray multi-layer mirror.

In order to attain the above-mentioned object, an X-ray multi-layer mirror according to the present invention includes an Mo/Si alternate layer with a non-uniform film thickness structure, which is produced by conducting optimization processing for widening an X-ray reflection characteristic on a constant film thickness fundamental structure of an Mo/Si alternate layer having the X-ray reflection characteristic, wherein each of all of Mo layers and Si layers for forming the non-uniform film thickness structure is designed to have a film thickness of 1.5 nm or more.

In the Mo/Si alternate layer, it was found from a sectional TEM photograph or the like that an MoSix layer formed in an interface between the Mo layer and the Si layer has a thickness of about 1 nm. Therefore, even when the X-ray multi-layer mirror having the non-uniform film thickness structure in which the Mo layer has a film thickness of 1.5 nm or less is designed by the optimization processing for widening an incident angle range in the reflection characteristic, a target reflection characteristic cannot be obtained because of the MoSix layer caused in the interface by actual film formation.

Therefore, the optimization processing is conducted under conditions that each of the layers has the film thickness of 1.5 nm or more, whereby the Mo/Si alternate layer having the non-uniform film thickness structure in which the influence of an interface layer is reduced is realized.

Thus formed X-ray multi-layer mirror having a wide range reflection characteristic is used to be able to significantly improve an optical characteristic of an X-ray exposure apparatus.

DETAILED DESCRIPTION OF THE PREFERRED EMBODIMENTS

The embodiments of the present invention will be described with reference to the drawings.

Figure 1A:
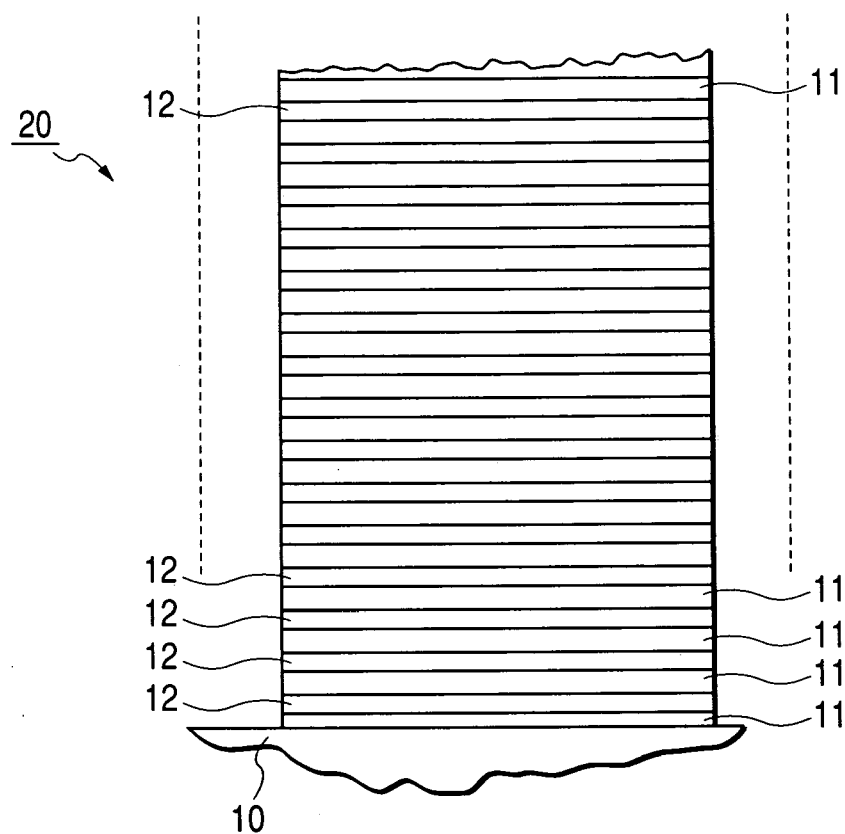
FIG. 1A is a view showing the film structure of an Mo/Si alternate layer according to an embodiment mode of the present invention.

FIG. 1A shows the film structure of an X-ray multi-layer mirror according to an embodiment of the present invention. The X-ray multi-layer mirror includes an Mo/Si alternate layer 20 having a non-uniform film thickness structure in which Si layers 11 and Mo layers 12 each having a design film thickness of 1.5 nm or more are alternately stacked on a substrate 10. That is, in order to realize a reflection characteristic with a wider incident angle range in respect of an Mo/Si alternate layer having a constant film thickness fundamental structure in which the Si layers 11 and the Mo layers 12 are alternately stacked and the film thickness of the layers is kept constant in the stack, the Mo/Si alternate layer has the non-uniform film thickness structure determined by optimization processing so that the film thickness of each of the layers becomes 1.5 nm or more.

Figure 1B:
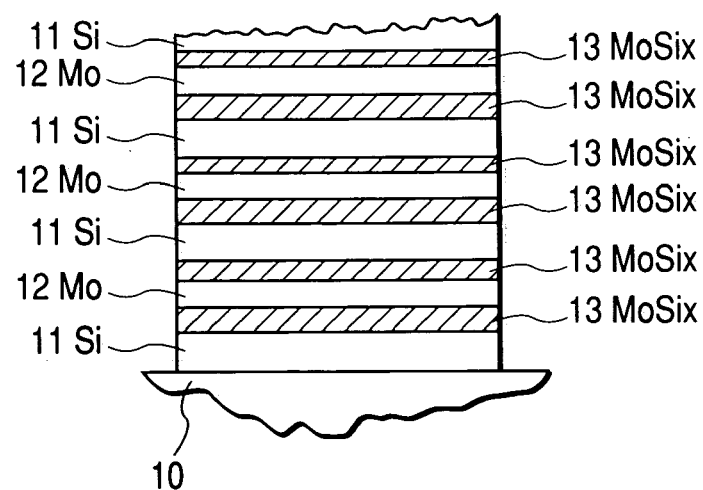
FIG. 1B is an enlarged view showing a part of the Mo/Si alternate layer shown in FIG. 1A.

When the Mo/Si alternate layer is formed by sputtering or the like, as shown in an enlarged form in FIG. 1B, it was found from a sectional TEM photograph or the like that an MoSix layer having a thickness of about 1 nm is generated in an interface between the Si layer 11 and the Mo layer 12. In order to avoid the influence of the MoSix layer on the reflection characteristic, the optimization processing is conducted under conditions that a minimum thickness of each of the layers is set to 1.5 nm or more. Therefore, the reflection characteristic of the Mo/Si alternate layer having the non-uniform film thickness structure after the film formation can be prevented from significantly deviating from a design value.

Figure 9:
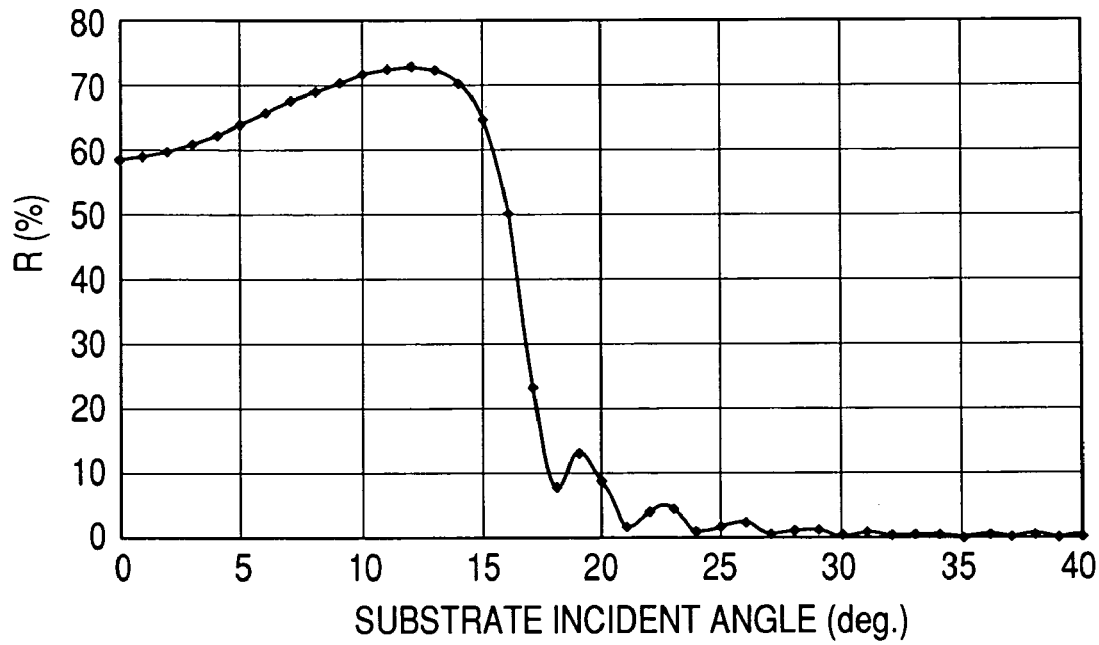
FIG. 9 is a graph showing an angle reflection characteristic in Fundamental Example 1.
Figure 10:
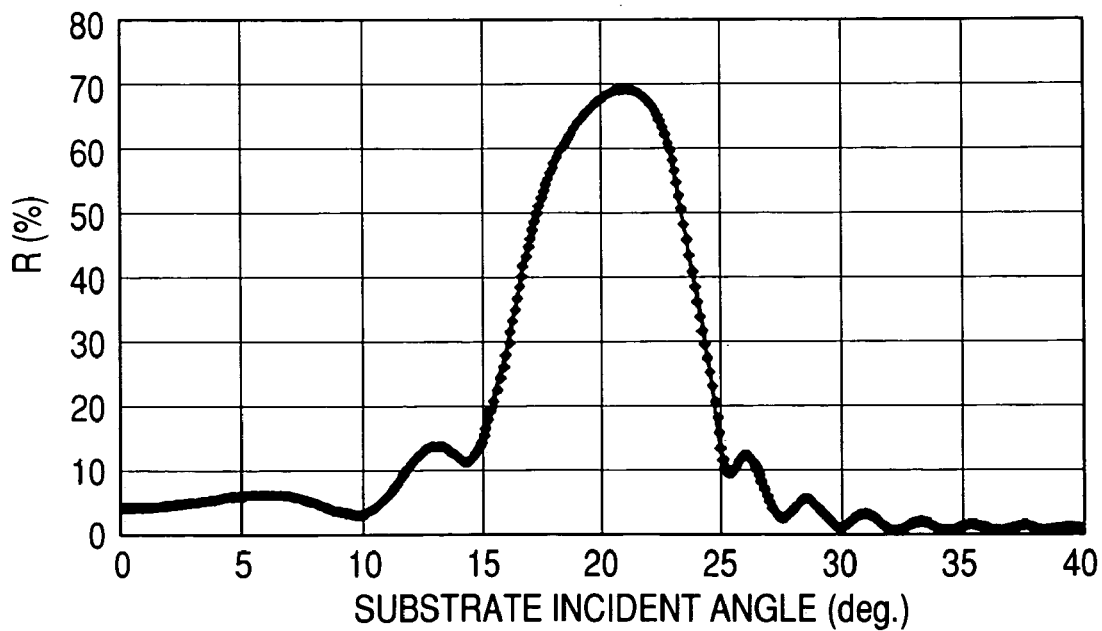
FIG. 10 is a graph showing an angle reflection characteristic in Fundamental Example 2.

FIG. 9 shows an angle reflection characteristic of Fundamental Example 1. In Fundamental Example 1, an Mo/Si alternate layer composed of 121 layers in total has a distributed Bragg reflecting structure (constant film thickness fundamental structure) similar to a ¼ wavelength stack having an entirely constant film thickness, and a high reflectance region to a soft X-ray having a wavelength of 13.5 nm being in an incident angle range of 0 degrees to 15 degrees. Similarly, FIG. 10 shows an angle reflection characteristic of Fundamental Example 2. In Fundamental Example 2, an Mo/Si alternate layer having a constant film thickness fundamental structure and composed of the Mo layers and the Si layers each having a constant film thickness has a high reflectance region having an incident angle range of 18 degrees to 23 degrees and composed of 121 layers in total.

In order to increase a region having a reflectance of, for example, 50% or more at a design wavelength of 13.5 nm in these fundamental structures, optimization processing using a known thin film design program is conducted under conditions that a minimum film thickness of each of the layers is set to 1.5 nm.

(Embodiment 1)

Figure 2:
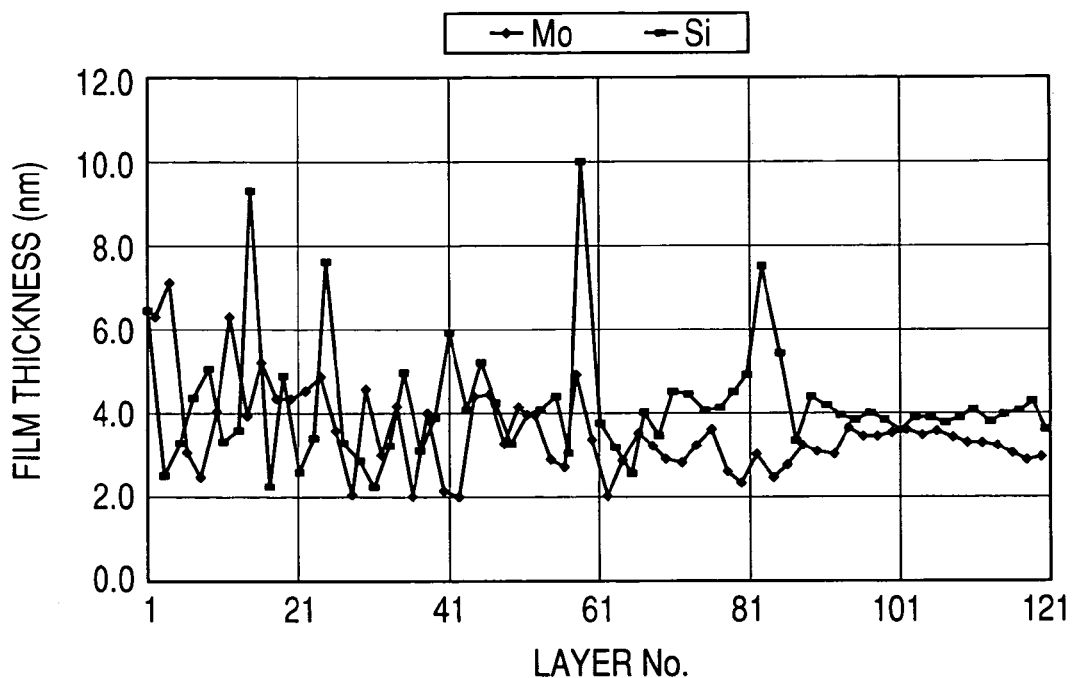
FIG. 2 is a graph showing a film thickness distribution of an Mo/Si alternate layer according to Embodiment 1 of the present invention.
Figure 3:
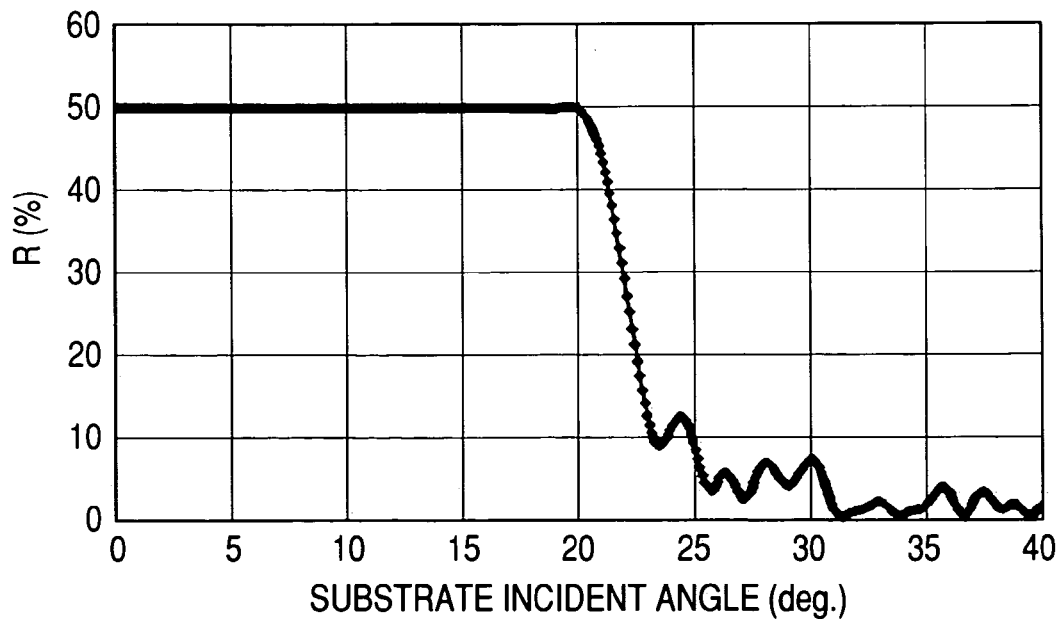
FIG. 3 is a graph showing an angle reflection characteristic according to Embodiment 1 of the present invention.

FIG. 2 is a graph showing a film thickness distribution of the Mo/Si alternate layer in the case where Fundamental Example 1 having the angle reflection characteristic shown in FIG. 9 is subjected to the optimization processing under the above-mentioned condition. In FIG. 2, a layer No. 1 indicates a first layer on a substrate. A film structure having 121 layers in total is used. A thickness of each of the Si layer and Mo layer is set to 1.5 nm or more. FIG. 3 is a graph showing an angle reflection characteristic of the film structure in FIG. 2. As compared with the X-ray multi-layer mirror having the fundamental structure of the ¼ wavelength stack with the constant film thickness as shown in FIG. 9, an incident angle range in which the reflectance is 50% or more increases by 5 degrees to become a range of 0 degrees to 20 degrees.

Figure 4:
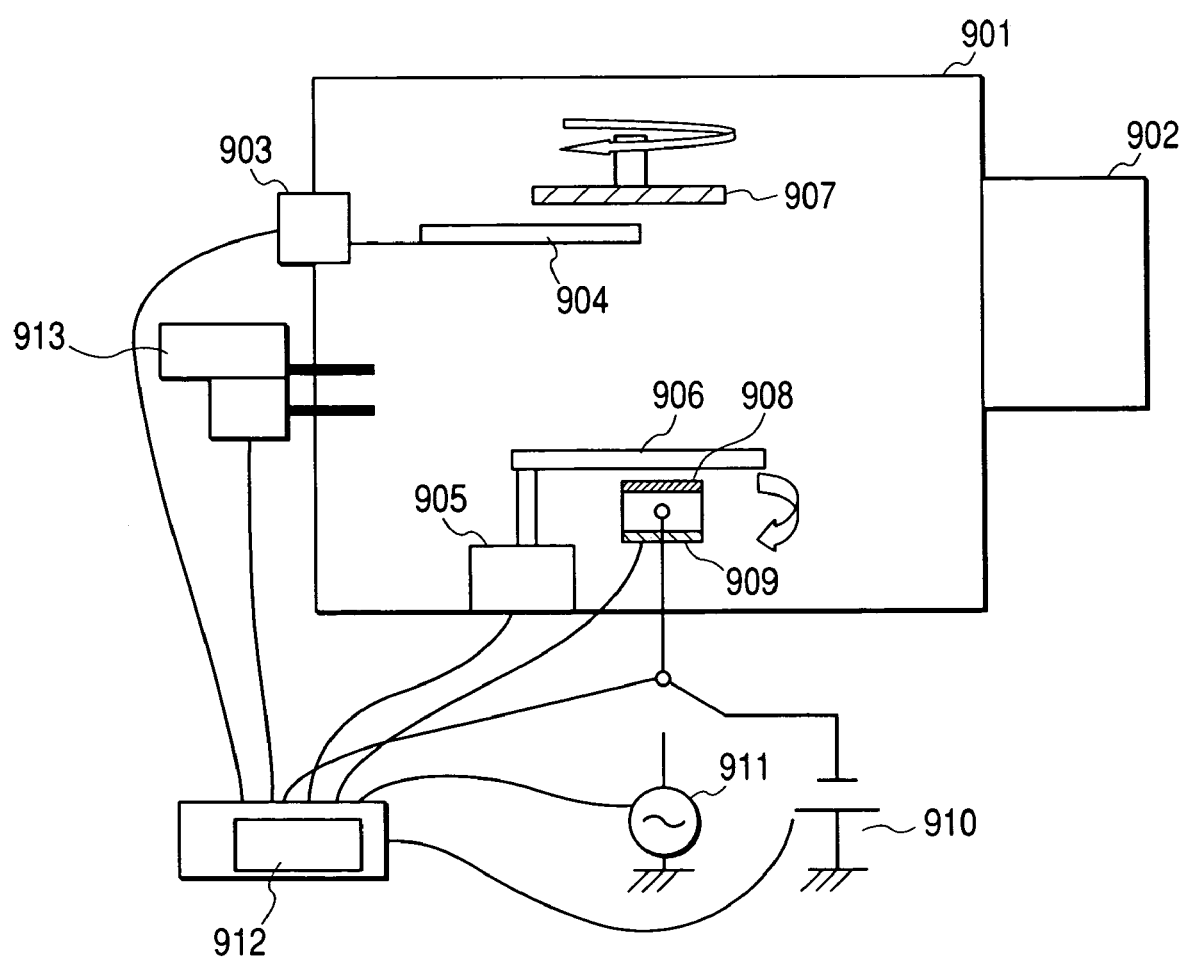
FIG. 4 is a schematic diagram showing a film formation apparatus used in Embodiment 1 of the present invention.

FIG. 4 is a schematic diagram showing a sputtering film formation apparatus used in this embodiment. The sputtering film formation apparatus includes a vacuum chamber 901, a vacuum pump 902 for vacuuming in the vacuum chamber 901, a movable mask 904 which is movable by a movable mask control device 903, a shutter 906 controlled by a shutter control device 905, a rotating mechanism 907 for holding and rotating a substrate, an Si target 908, an Mo target 909, a DC power source 910, an RF power source 911, a computer 912, and Ar/Xe gas introduction control device 913. All control systems are connected with the computer and can be integrally controlled. The Mo/Si alternate layer is formed by the following operation using the sputtering film formation apparatus.

B-doped polycrystalline Si material and a metal Mo material are provided as the targets 908 and 909 each having a diameter of four inches, respectively. The targets 908 and 909 are rotated and then the materials are alternately selected to alternately form the Si layer and Mo layer on the substrate.

Figure 5:
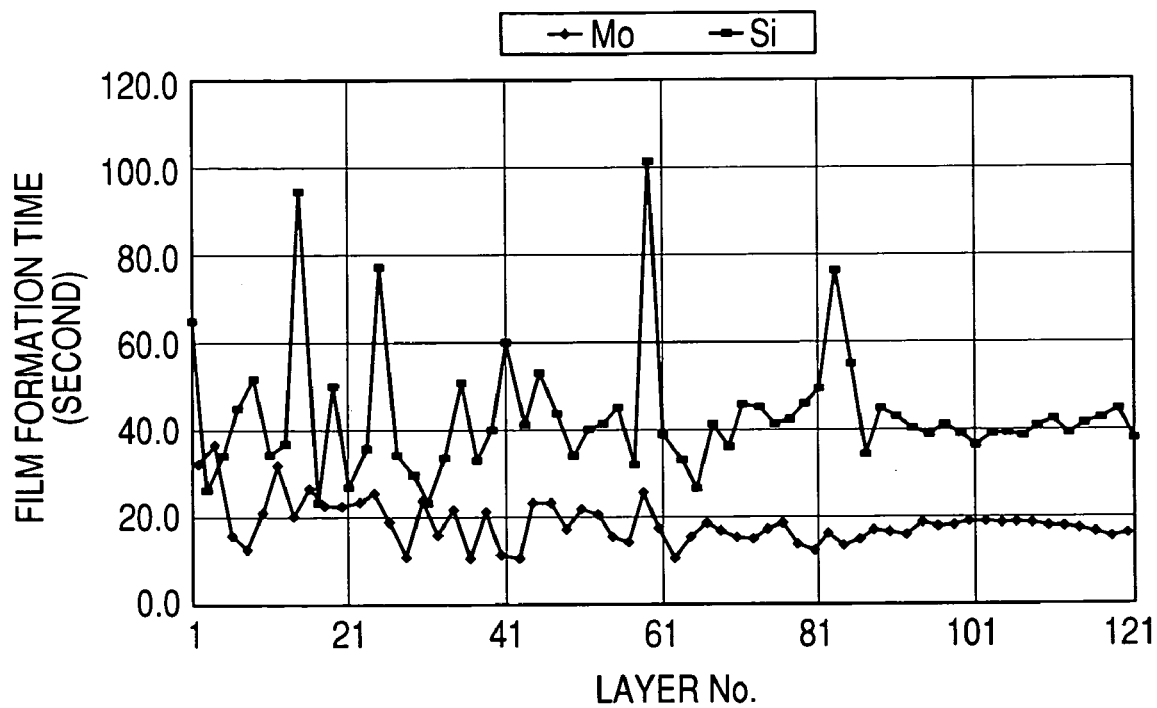
FIG. 5 is a graph showing a film thickness control according to Embodiment 1 of the present invention.

Low expansion glass having a diameter of 500 mm and a thickness of 35 mm is used for the substrate and rotated during the film formation. The shutter 906 and the movable mask 904 for controlling a film thickness distribution on the substrate are provided between the substrate and the targets 908 and 909. With respect to a process gas introduced into a film formation atmosphere, an Ar gas is introduced at 10 sccm during the Si film formation and an Xe gas is introduced at 50 sccm during the Mo film formation. With respect to the power applied to the targets 908 and 909, high frequency (RF) power of 150 W having a wavelength of 13.56 MHz is applied during the Si film formation and DC power of 100 W is applied during the Mo film formation. A film thickness of each of the Si layer and the Mo layer is controlled with time by the computer 912. FIG. 5 is a graph showing film formation data for each of the layers, which is inputted to the computer 912.

The mirror thus formed has a preferable reflection characteristic in which a reflectance of 50% is maintained at an incident angle of up to 20 degrees, as a design value.

Figure 6:
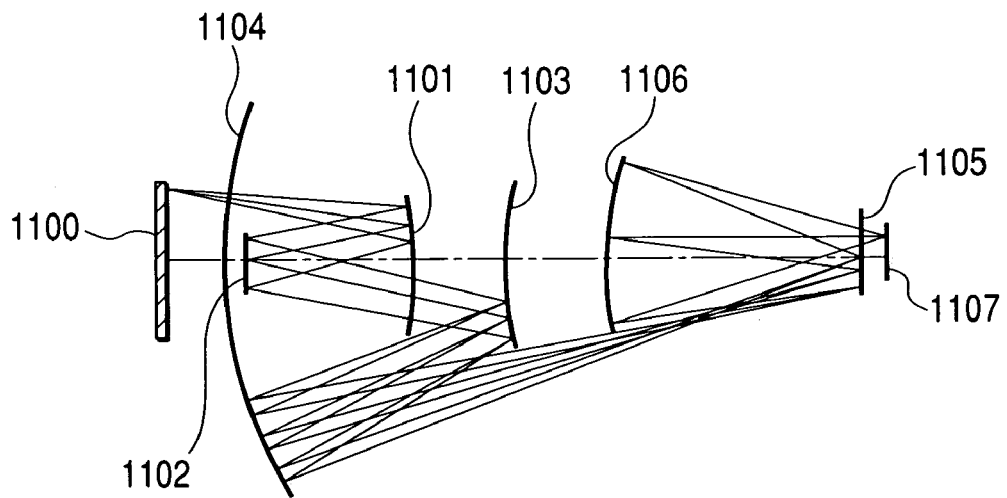
FIG. 6 is an explanatory view showing an optical system of an X-ray exposure apparatus according to Embodiment 1 of the present invention.

FIG. 6 shows a reflection reduced projection optical system of a reflection type reduced projection exposure apparatus (stepper) using the X-ray multi-layer mirror according to Embodiment 1. A soft X-ray having a wavelength of 13.5 nm is used for a light source. A pattern formed in a reflection type mask 1100 serving as an original plate is transferred to a resist on a wafer 1107 serving as the substrate by the reflection reduced projection optical system which is composed of first, second, third, fourth, fifth, and sixth reflection mirrors multi-layer mirror according to Fundamental Example 1 as shown in FIG. 9 is used for the reflection mirrors 1101, 1102, 1104, and 1106 in which an incident angle range thereon is 5 degrees or less. The X-ray multi-layer mirror according to Embodiment 1 is used for the reflection mirrors 1103 and 1105 in which an incident angle range thereon is 5 degrees or more. Therefore, when a pattern of 0.1 μm on a mask is used, a resist pattern having a size of 0.025 μm is obtained with high precision.

(Embodiment 2)

Figure 7:
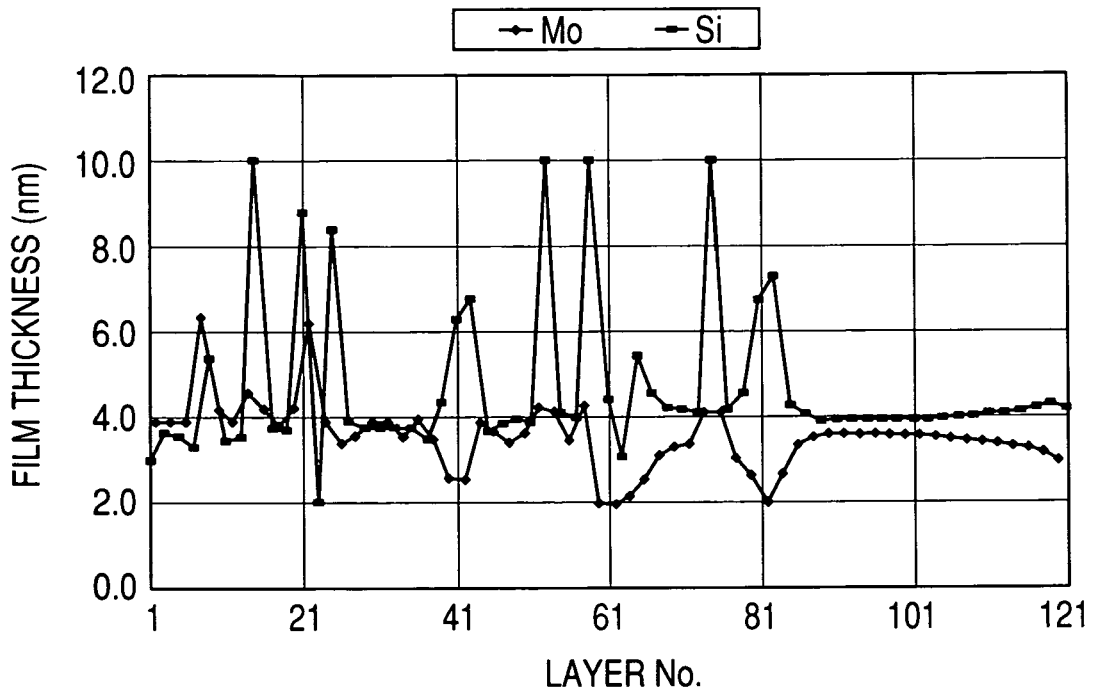
FIG. 7 is a graph showing a film thickness distribution according to Embodiment 2 of the present invention.
Figure 8:
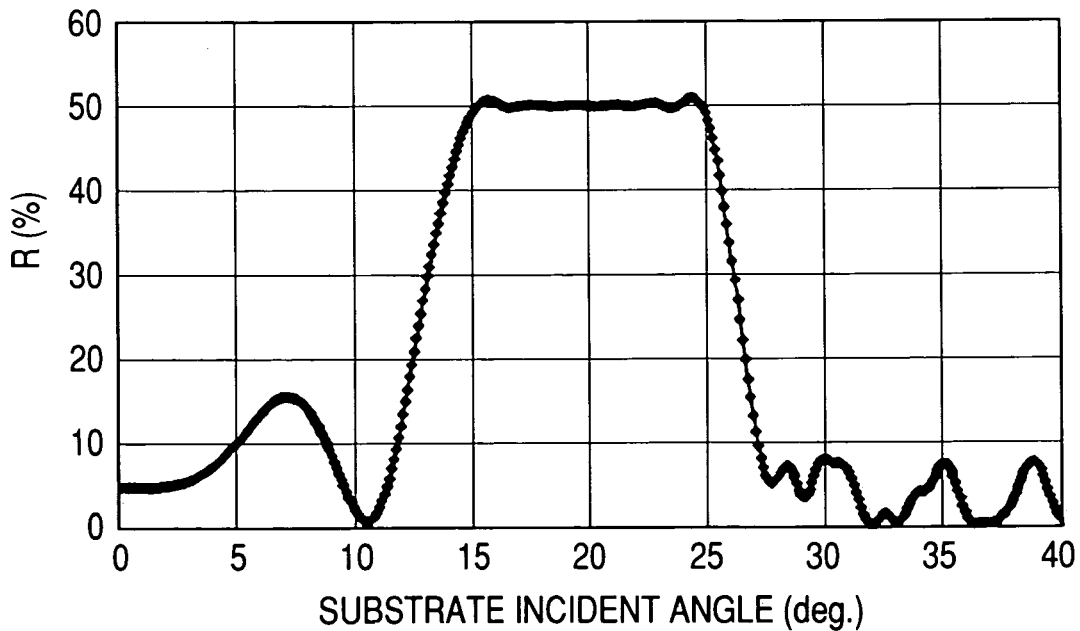
FIG. 8 is a graph showing an angle reflection characteristic according to Embodiment 2 of the present invention.

FIG. 7 is a graph showing a film thickness distribution of each of the Mo layer and the Si layer in the case where Fundamental Example 2 shown in FIG. 10 is subjected to the optimization processing under conditions that the minimum film thickness is set to 1.5 nm. In FIG. 7, a layer No. 1 indicates a first layer on a substrate. A film structure is composed of 121 layers in total. A thickness of each of the Si layer and Mo layer is set to 1.5 nm or more. FIG. 8 is a graph showing an angle reflection characteristic of the film structure in this embodiment. As compared with the angle reflection characteristic shown in FIG. 10, the range in which the reflectance is 50% or more increases by 3 degrees or more to become a range of 15 degrees to 25 degrees. The Mo/Si alternate layer was formed by the same film formation method as in Embodiment 1 and the reflection characteristic thereof was examined. As a result, the X-ray multi-layer mirror having a wide reflection characteristic as designed was obtained.

In Embodiments 1 and 2, the film formation method for each of the layers is not limited to sputtering and may be another film formation method such as an evaporation.

According to the above-mentioned structure of the present invention, the following effect is obtained.

It is possible to produce an X-ray multi-layer mirror having a high reflectance over a wide incident angle range. Therefore, a performance of an X-ray exposure apparatus can be improved.

What is claimed is:

1. An X-ray multi-layer mirror comprising an Mo/Si alternate layer with a non-uniform, non-periodic film thickness structure, which is produced by conducting optimization processing for widening an X-ray reflection characteristic on a constant film thickness fundamental structure of an Mo/Si alternate layer having the X-ray reflection characteristic, wherein each one of Mo layers and Si layers for forming the non-uniform film thickness structure is designed to have a film thickness of 1.5 nm or more.

2. An X-ray exposure apparatus comprising a projection optical system comprising an X-ray multi-layer mirror according to claim 1, wherein a pattern of an original plate is transferred to a substrate by the projection optical system.

* * * * *

UNITED STATES PATENT AND TRADEMARK OFFICE
CERTIFICATE OF CORRECTION

| | | |
|---|---|---|
| PATENT NO. | : 7,162,009 B2 | Page 1 of 1 |
| APPLICATION NO. | : 10/902149 | |
| DATED | : January 9, 2007 | |
| INVENTOR(S) | : Hidehiro Kanazawa et al. | |

It is certified that error appears in the above-identified patent and that said Letters Patent is hereby corrected as shown below:

COLUMN 4

Line 39, "mirrors" should read --mirrors 1101, 1102, 1103, 1104, 1105, and 1106. The X-ray--.

Signed and Sealed this

Twenty-eighth Day of August, 2007

JON W. DUDAS
*Director of the United States Patent and Trademark Office*